(12) United States Patent
Korobkov

(10) Patent No.: US 8,190,407 B2
(45) Date of Patent: May 29, 2012

(54) METHOD AND SYSTEM FOR EVALUATING A DEVICE DURING CIRCUIT SIMULATION

(75) Inventor: Alexander Korobkov, Santa Clara, CA (US)

(73) Assignee: Oracle America, Inc., Redwood City, CA (US)

(*) Notice: Subject to any disclaimer, the term of this patent is extended or adjusted under 35 U.S.C. 154(b) by 555 days.

(21) Appl. No.: 12/390,270

(22) Filed: Feb. 20, 2009

(65) Prior Publication Data
US 2010/0217569 A1 Aug. 26, 2010

(51) Int. Cl.
*G06F 7/60* (2006.01)
*G06F 17/50* (2006.01)
*G06F 9/45* (2006.01)
*G06F 9/455* (2006.01)
*G06G 7/54* (2006.01)

(52) U.S. Cl. ............ 703/2; 703/14; 703/18; 703/19; 716/103; 716/109; 716/111; 716/112

(58) Field of Classification Search .......... 703/2, 13, 703/14, 18, 19; 716/103, 109, 111, 112
See application file for complete search history.

(56) References Cited

U.S. PATENT DOCUMENTS

| | | | | |
|---|---|---|---|---|
| 5,553,008 A | * | 9/1996 | Huang et al. | 703/14 |
| 5,668,732 A | * | 9/1997 | Khouja et al. | 702/60 |
| 5,696,694 A | * | 12/1997 | Khouja et al. | 716/120 |
| 5,903,469 A | * | 5/1999 | Ho | 716/115 |
| 5,903,476 A | * | 5/1999 | Mauskar et al. | 716/109 |
| 5,999,726 A | * | 12/1999 | Ho | 716/112 |
| 6,075,932 A | * | 6/2000 | Khouja et al. | 716/109 |
| 6,195,630 B1 | * | 2/2001 | Mauskar et al. | 703/18 |
| 6,272,664 B1 | * | 8/2001 | Chang et al. | 716/103 |

(Continued)

OTHER PUBLICATIONS

Meijer, Peter. "Fast and Smooth Highly Nonlinear Multidimensional Table Models for Device Modeling", IEEE Transactions on Circuits and Systems, vol. 37, No. 3, Mar. 1990.*

(Continued)

*Primary Examiner* — Shambhavi Patel
(74) *Attorney, Agent, or Firm* — Osha • Liang LLP

(57) ABSTRACT

A method for evaluating a device during circuit simulation includes receiving a first request including a first input value; and mapping the first input value to a first space in a table. The table is configured to store one or more table entries. A table entry includes an input value and a stored value. The stored value is obtained as a function of the input value from an analytical device model used to characterize the device during circuit simulation. The method includes determining whether the first space in the table is occupied by a first table entry; selecting a second table entry and a third table entry from the table when the first space in the table is not occupied by the first table entry, wherein the second table entry and the third table entry are neighbors in relation to the first space in the table; determining whether an accuracy criteria for performing a linear interpolation is satisfied as a function of the first input value, a stored value for the second table entry, and a stored value for the third table entry; and obtaining a first response value by performing the linear interpolation of the stored value for the second table entry and the stored value for the third table entry when the accuracy criteria is satisfied; and sending a response to the first request including the first response value. The first response value corresponds with the performance of the device when the device is configured using the first input value.

14 Claims, 5 Drawing Sheets

U.S. PATENT DOCUMENTS

| | | | |
|---|---|---|---|
| 6,567,960 B2 * | 5/2003 | Chang et al. | 716/113 |
| 7,266,479 B2 * | 9/2007 | Yang et al. | 703/2 |
| 7,647,220 B2 * | 1/2010 | Kulshreshtha et al. | 703/19 |
| 2004/0049370 A1 * | 3/2004 | Stanley et al. | 703/14 |
| 2004/0181761 A1 * | 9/2004 | Kidera | 716/2 |

OTHER PUBLICATIONS

Tan, Xiang-Dong. "Symbolic Analysis of Large Analog Circuits with Determinant Decision Diagrams", May 1999.*

Somenzi, Fabio. "Efficient manipulation of decision diagrams", Int J STTT (2001) 3: 171-181.*

Wan et al. "Hierarchical Multi-Dimensional Table Lookup for Model Compiler based Circuit Simulation", IEEE 2004.*

Bryant et al. "Verification of Arithmetic Circuits with Binary Moment Diagrams", ACM 1995.*

Brauns et al. "Table-Based Modeling of Delta-Sigma Modulators Using ZSIM", IEEE Transactions on Computer-Aided Design, vol. 9. No. 2, Feb. 1990.*

Fang et al. "Fast, Accurate MOS Table Model for Circuit Simulation Using an Unstructured Grid and Preserving Monotonicity", IEEE 2005.*

Harrison, John. "Binary Decision Diagrams as a HOL Derived Rule", The Computer Journal, vol. 38, No. 2, 1995.*

Wan, Bo et al., "Design—Adaptive Device Modeling in Model Compiler for Efficient and Accurate Circuit Simulation", IEEE, Copyright 2004, pp. 113-118 (6 Pages).

Nadezhin, D. et al., "SOI transistor model for fast transient simulation", ICCAD 03, Nov. 11-13, 2003, Copyright 2003, pp. 120-127 (8 Pages).

Lewis, David M., "Device Model Approximation Using 2N Trees", IEEE Transactions on Computer—Aided Design, vol. 9, No. 1, Jan. 1990, Copyright 1990, pp. 30-38 (9 Pages).

* cited by examiner

METHOD AND SYSTEM FOR EVALUATING A DEVICE DURING CIRCUIT SIMULATION

BACKGROUND

Transistor level circuit simulation tools typically require MOSFET (i.e. metal-oxide-semiconductor field-effect transistor) device precharacterization for a variety of operational input parameters. Recent advances in process technology used in the designing and manufacturing of transistor devices have introduced a multitude of new physical effects. Accordingly, the introduction of these new physical effects likewise introduces an increase in the number of unique device instances. As a result, there is a greater cost in generating a now greater number of unique table models which serve to precharacterize each of the possible unique device instances. As a consequence, device calibration and circuit simulation now impose higher requirements in terms of computational and storage capability.

SUMMARY

In one aspect, embodiments of the present invention relate to a method for evaluating a device during circuit simulation, comprising: receiving a first request comprising a first input value; mapping the first input value to a first space in a table, wherein the table is configured to store one or more table entries, wherein a table entry comprises an input value and a stored value, and wherein the stored value is obtained as a function of the input value from an analytical device model used to characterize the device during circuit simulation; determining whether the first space in the table is occupied by a first table entry; selecting a second table entry and a third table entry from the table when the first space in the table is not occupied by the first table entry, wherein the second table entry and the third table entry are neighbors in relation to the first space in the table; determining whether an accuracy criteria for performing a linear interpolation is satisfied as a function of the first input value, a stored value for the second table entry, and a stored value for the third table entry; obtaining a first response value by performing the linear interpolation of the stored value for the second table entry and the stored value for the third table entry when the accuracy criteria is satisfied, wherein the first response value corresponds with the performance of the device when the device is configured using the first input value; and sending a response to the first request comprising the first response value.

In one aspect, embodiments of the present invention relate to a system for evaluating a device during circuit simulation, comprising: a circuit simulation engine configured to send a first request comprising a first input value; a table configured to store one or more table entries, wherein a table entry comprises an input value and a stored value, and wherein the stored value is obtained as a function of the input value from an analytical device model used to characterize the device during circuit simulation; an interpolator configured to perform a linear interpolation of neighboring table entries in the table to obtain a first response value using a first space in the table and the first input value; a control module configured to: receive the first request comprising the first input value from the circuit simulation engine; map the first input value to the first space in the table; determine whether the first space in the table is occupied by a first table entry; provide the first response value and the first space in the table to the interpolator to obtain the first response value when the first space in the table is not occupied by a first table entry and when an accuracy criteria for performing the linear interpolation is satisfied; and send a response to the first request comprising the first response value to the circuit simulation engine, wherein the first response value corresponds with the performance of the device when the device is configured using the first input value.

In one aspect, one or more embodiments of the present invention relate to a computer readable medium comprising executable instructions for evaluating a device during circuit simulation, wherein executable instructions comprise instructions to cause a computer to perform: receiving a first request comprising a first input value; mapping the first input value to a first space in a table, wherein the table is configured to store one or more table entries, wherein a table entry comprises an input value and a stored value, and wherein stored value is obtained as a function of the input value from an analytical device model used to characterize the device during circuit simulation; determining whether the first space in the table is occupied by a first table entry; selecting a second table entry and a third table entry from the table when the first space in the table is not occupied by the first table entry, wherein the second table entry and the third table entry are neighbors in relation to the first space in the table; determining whether an accuracy criteria for performing a linear interpolation is satisfied as a function of the first input value, a stored value for the second table entry, and a stored value for the third table entry; obtaining a first response value by performing the linear interpolation of the stored value for the second table entry and the stored value for the third table entry when the accuracy criteria is satisfied, wherein the first response value corresponds with the performance of the device when the device is configured using the first input value; and sending a response to the first request comprising the first response value.

Other aspects of the invention will be apparent from the following description and the appended claims.

DETAILED DESCRIPTION

Figure 1:
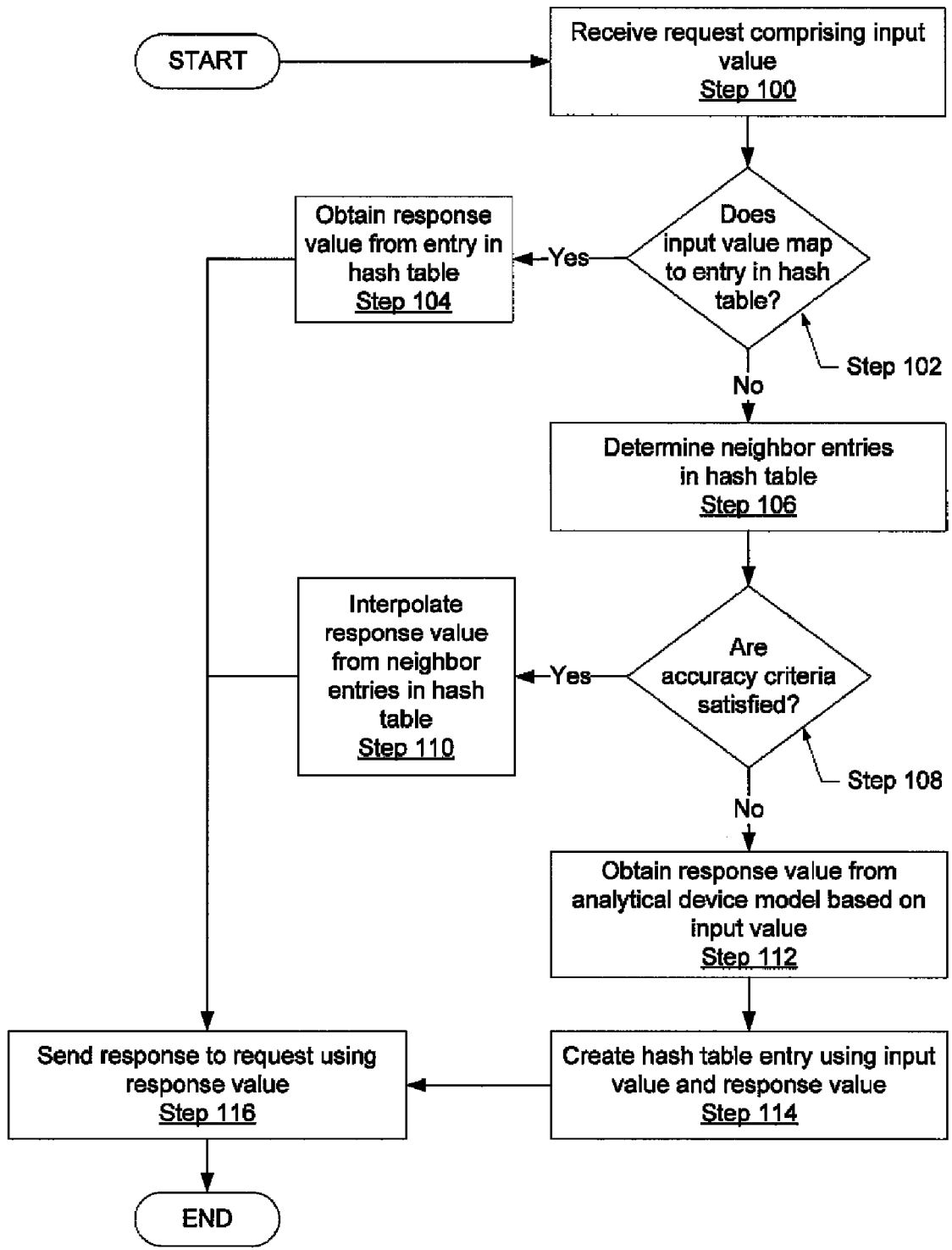
FIG. 1 shows a flowchart in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention provide a method and a system for evaluating a device during circuit simulation.

More specifically, embodiments of the invention are directed to processing a request by interpolating between two existing entries stored in a table.

FIG. 1 shows a flowchart in accordance with one or more embodiments of the invention. The process shown in FIG. 1 may be used, for example, to obtain a response value for an evaluation request of a device specifying an input value.

In Step 100, a request is received specifying an input value. In one or more embodiments of the invention, the request is generated when evaluating a device for a circuit simulation.

In Step 102, a determination is made as to whether the input value maps to an entry stored in a hash table. A hash table is a data structure that associates an input value with a stored value in the hash table by using a hash function. In one or more embodiments of the invention, the hash table stores values that characterize a device for a circuit simulation. In one or more embodiments of the invention, the hash table does not store any precharacterized data (i.e. data descriptive of the device generated prior to executing the circuit simulation). Rather, the data stored in table entries is obtained during the course of circuit simulation. An example of a hash table in accordance with one or more embodiments of the invention is discussed in relation to FIG. 2a.

Returning to FIG. 1, in one or more embodiments of the invention, a hash function associated with the hash table is used to map the specified input value to a space in the hash table. As such, the space in the hash table may be occupied by a table entry in which case Step 104 is performed next. Alternatively, the space in the hash table may be empty (i.e. not be occupied by a table entry) in which case Step 106 is performed next.

In Step 104, a response value is obtained from the table entry in the hash table. In one or more embodiments of the invention, when the input value maps to a space occupied by an entry in the hash table, the response value corresponding with the input value is the stored value for the entry in the hash table. As a response value is now obtained, no further processing is required and Step 116 is performed next.

In Step 106, neighbor table entries in the hash table are determined. As such, the neighbor table entries are the table entries most proximate to the mapped-to space in the table (from Step 102). As an example, the process of selecting neighbor table entries is discussed in greater detail in relation to FIGS. 2a and 2b.

In Step 108, a determination is made as to whether the neighbor table entries, when considered with the input value, satisfy a defined accuracy criteria. Examples of accuracy criteria are discussed in greater detail with regards to FIGS. 3a-3d. If the accuracy criteria is satisfied, then Step 110 is performed next. Alternatively, when the accuracy criteria is not satisfied, Step 112 is performed next.

In Step 110, the neighbor table entries determined in Step 106 are used to interpolate a response value. More specifically, a linear interpolation is performed to calculate the response value as a function of the stored values associated with the neighbor table entries. As a response value is now obtained, no further processing is required and Step 116 is performed next.

In Step 112, a response value is obtained from an analytical device model. An analytical device model performs a calculation using a specified input and, as a result, provides a calculated response value. More specifically, an analytical device model is used to provide values that characterize devices such as, but not limited to, MOSFET devices. For example, in one or more embodiments of the invention, an analytical device model may receive device parameters and terminal voltages as inputs (such as the input value specified with the received request in Step 100). In processing these inputs, the analytical device model may provide, as a response, calculated current and capacitance values associated with each device terminal in correspondence with specified inputs.

In Step 114, a hash table entry is created using the input value (received in Step 100) and the response value (obtained in Step 112). In one or more embodiments of the invention, the space in the hash table to which the input value maps (obtained in Step 102) is the location of the new table entry. Further, in one or more embodiments of the invention, the stored value for the new table entry is the response value.

In Step 116, once the response value has been obtained, a response is created and sent specifying the response value. In one or more embodiments of the invention, the response value corresponds with the performance of the device when the device is configured using a particular input value.

Figure 2A:
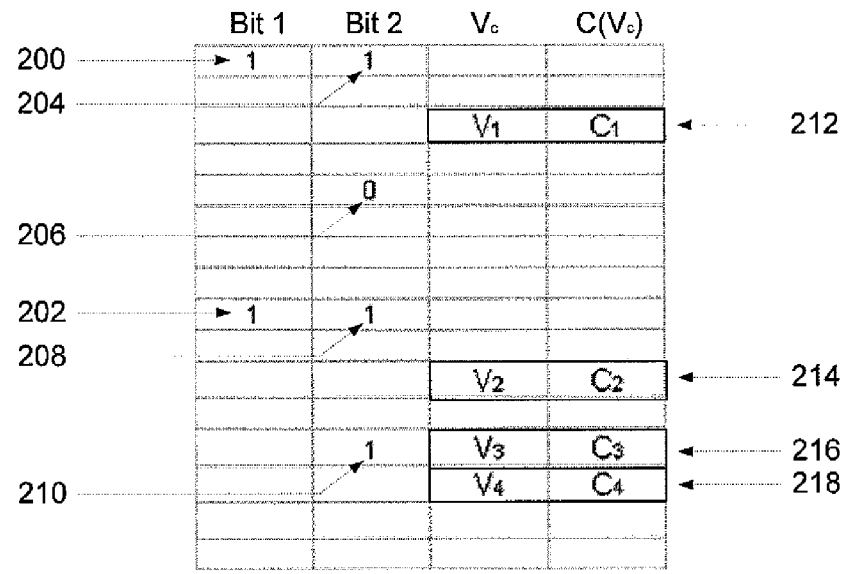
FIGS. 2a and 2b show data maintained in accordance with one or more embodiments of the invention.
Figure 2B:
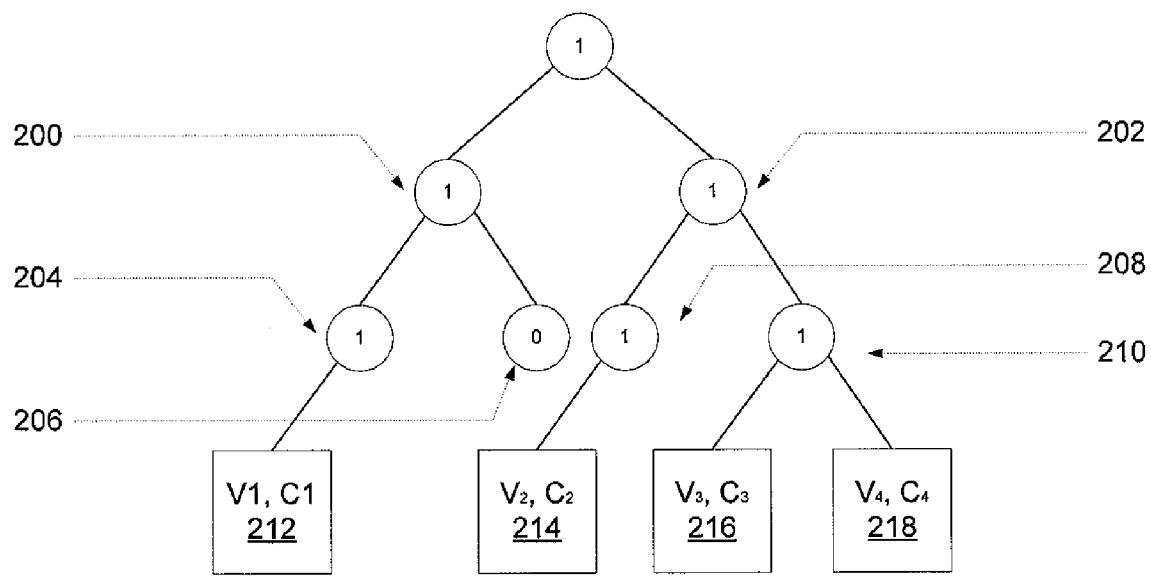

FIGS. 2a and 2b show data maintained in accordance with one or more embodiments of the invention.

The table of FIG. 2a is a hash table in accordance with one or more embodiments of the invention. More specifically, the table is configured to store a capacitance value ("$C(V_c)$") for a device as a function of a voltage over capacitor input value ("$V_c$"). Said another way, the stored capacitance value pertains to the performance of the device when the device is configured using a particular voltage over capacitor input value. Returning to the Figure, each row in the table represents a space in the hash table which can be mapped to for some input value by a hash function associated with the table. For example, row 212 stores a table entry having a capacitance of $C_1$ for an input value of $V_1$. Further, the rows directly above and directly below row 212 serve as examples of spaces in the hash table to which the hash function has yet to map and store a table entry.

In one or more embodiments of the invention, rows in the table are grouped to improve the search efficiency for the table. For example, the sixteen rows of the table in FIG. 2a are halved once to create two groupings of eight rows and then subsequently halved again to create four groupings of four rows. Further, bit values are maintained to provide an indication of whether any table entries are (1) or are not (0) stored in correspondence with a particular grouping of rows. For example, the bit value maintained in the first column of the first and ninth rows indicate whether there are any table entries stored in the first and second groupings of eight rows respectively. Further, the bit value maintained in the second column of the first, the fifth, the ninth, and the thirteenth rows indicate whether there are any table entries stored in the first, second, third, and fourth groupings of four rows respectively.

FIG. 2b is an example of a binary tree that is abstracted from the hash table of FIG. 2a. The binary tree of FIG. 2b has a single top-most root node, a second tier of nodes (200, 202), a third tier of nodes (204, 206, 208, 210), and four leaf nodes (212, 214, 216, 218). Nodes 200 and 202 correspond respectively with the top eight rows and the bottom eight rows of the hash table. Nodes 204, 206, 208, and 210 correspond respectively with the first, second, third, and fourth groupings of four rows of the hash table. Further, non-leaf nodes (root, 200, 202, 204, 206, 208, 210) maintain the bit value that is indicative of whether any table entries are stored in the grouping of rows that correspond appropriately with each of the non-leaf nodes. To illustrate: (i) for the root node, the 1-value indicates that the sixteen rows in the hash table do store at least one table entry (212, 214, 216, 218); (ii) for node 200, the 1-value indicates that the top-most eight rows in the hash table do store at least one table entry (212); (iii) for node 202, the 1-value indicates that the bottom-most eight rows in the hash table do store at least one table entry (214, 216, 218); (iv) for node 204, the 1-value indicates that the first four rows in the hash table do store at least one table entry (212); (v) for node 206, the 0-value indicates that the second four rows in the hash table do not store any table entries; (vi) for node 208, the 1-value indicates that the third four rows in the hash table do store at least one table entry (214); (vii) for node 210, the 1-value indicates that the fourth and final four rows in the hash table do store at least one table entry (218).

FIGS. 2a and 2b together are further instructive in illustration of performing a search for the most proximate neighbor table entries for a provided input value. As such, in one or more embodiments of the invention, one or more searches of a binary tree generated as a function of a hash table is iteratively performed bottom-up and then top-bottom using the input value as a starting point.

For the purposes of an example, assume the goal is to find the closest neighbors for leaf 214 such that leaf 214 will be positioned in the hash table between a neighbor that precedes it and a neighbor that follows it. As such, a search begins at leaf 214, which is effectively the eleventh row in the table. By iterating up the binary tree from the leaf, the search first finds the parent node for leaf 214 which is node 208. The bit value at node 208, which is 1, indicates that at least one table entry is stored in rows 9-12 nested beneath. Accordingly, the search proceeds to reference the ninth, tenth, and twelfth rows (omitting the eleventh row which is the input value) in the hash table for purposes of finding neighbors. In this instance, leaf 214 turns out to be the stored table entry nested beneath node 208 as the ninth, tenth, and twelfth rows are unoccupied by table entries.

In an attempt to find a closest preceding neighbor to node 214, another search iterates upward from node 208 to node 202, upward from node 202 to the root node, downward from the root node to node 200, and downward from node 200 to node 206. As described, the search is performed bottom-up and then top-bottom. Said another way, the search begins at a leaf node in the tree and iterates upwards first and then later downwards as it attempts to find the closest neighboring node. As the search iterates to each node in the tree, the search can read the bit value at the node and determine whether there are any leaves nested beneath. Subsequently, the search ends when it arrives either at a node that has a 0 for the bit value (i.e. no leaves stored nested beneath the node) or a leaf node for a stored table entry is found. Returning to the described search, node 206 stores a bit value of 0, indicating that no table entries are stored among the grouping of rows 5-8 nested beneath it. As such, the search has not found a leaf node for a stored table entry and therefore has yet to find a closest neighbor preceding node 214 in the hash table.

In continuance, another search iterates upward from node 214 to node 208, iterates upward from node 208 to node 202, and then iterates downward from node 202 to node 210. Having found node 210, the search reads that the bit value at node 210 is 1, indicating that at least one table entry is stored among the grouping of rows 13-16 nested beneath it. To find the closest neighbor among the grouped rows, the search begins at the thirteenth row where leaf 216 happens to be stored. As such, leaf 216 qualifies as the closest neighbor that follows leaf 214 in the hash table and a first neighbor for leaf 214 has been found.

The search continues for purposes of finding the next closest neighbor for leaf 214 in the hash table. A search iterates bottom-up and then top-bottom, as previously described, beginning at node 214 through node 208, node 202, the root node, and node 200. The bit value at node 204 is 1 which indicates that at least one table entry is stored among the grouping of rows 1-4 nested beneath it. To find the closest neighbor among the grouped rows, the search begins at the fourth row which is unoccupied. The search iterates a row further back in the hash table to the third row where leaf 212 is stored. As such, leaf 212 qualifies as the next closest neighbor for leaf 214 in the hash table.

In the instance of the above-described search, the input value from which the search started was a stored table entry. However, this is merely an example of one or more embodiments of the invention. In one or more embodiments of the invention, a search may begin at any space in the hash table provided there is an input value that maps to that particular space. For example, in relation to Step 106 described in FIG. 1, the input value may be such that the hash function for the hash table maps it to an unoccupied space in the hash table. As such, the determination of neighboring entries in the table with relation to the unoccupied space is a requirement for performing the linear interpolation of Step 110.

FIG. 3a-3d show data maintained in accordance with one or more embodiments of the invention. Each figure depicts a first neighboring table entry (300), a second neighboring table entry (302), and a voltage over capacitor input value $V_i$ (304). As will be described below, the figures vary from one another in how these depicted elements are positioned in relation to each other.

Figure 3A:
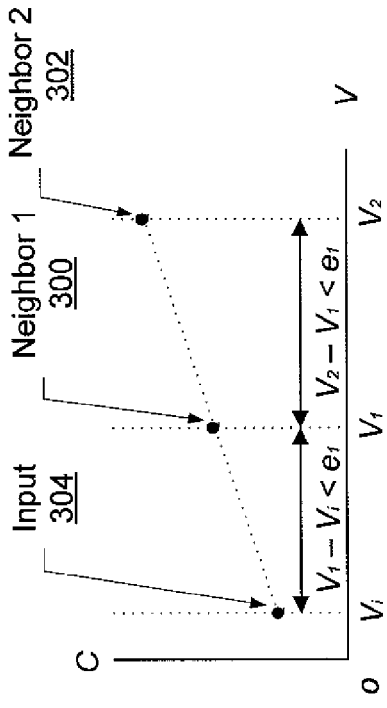
FIGS. 3a-3d show data maintained in accordance with one or more embodiments of the invention.
Figure 3B:
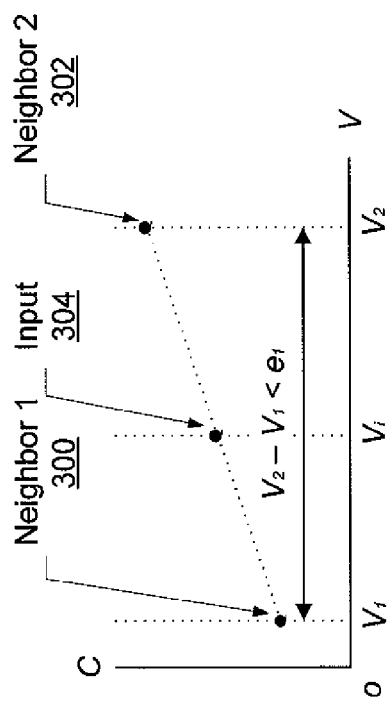

In FIG. 3a and FIG. 3b, the first neighboring table entry (300) is associated with a voltage value $V_1$ and the second neighboring table entry (302) is associated with a voltage value $V_2$. Further, there is a first defined accuracy constant $e_1$ pertaining to voltage. When $V_1 < V_i < V_2$ as is shown in FIG. 3a, $V_2 - V_1 < e_1$ for the accuracy criteria to be satisfied and thereby permit interpolation of a capacitance value for $V_i$ (304) using the neighboring table entries (300, 302). However, when $V_i < V_1 < V_2$ as is shown in FIG. 3b, $V_1 - V_i < e_1$ and $V_2 - V_1 < e_1$ for the accuracy criteria to be satisfied and thereby permit interpolation of a capacitance value for $V_i$ (304) using the neighboring table entries (300, 302). Not shown is a third case when $V_1 < V_2 < V_i$, for which $V_i - V_2 < e_1$ and $V_2 - V_1 < e_1$ for the accuracy criteria to be satisfied and thereby permit interpolation of a capacitance value for $V_i$ (304).

Figure 3C:
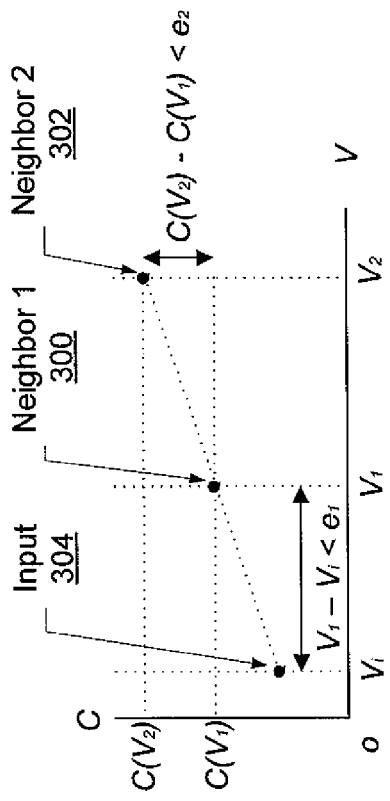
Figure 3D:
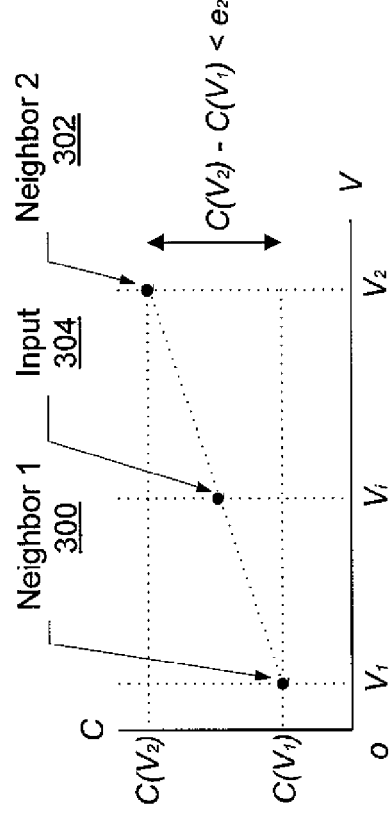

In FIG. 3c and FIG. 3d, the first neighboring table entry (300) is associated with a voltage value $V_1$ and a capacitance value $C(V_1)$ and the second neighboring table entry (302) is associated with a voltage value $V_2$ and a capacitance value $C(V_2)$. Further, there is an additionally-defined second accuracy constant $e_2$ pertaining to capacitance. When $V_1 < V_i < V_2$ as is shown in FIG. 3c, $C(V_2) - C(V_1) < e_2$ for the accuracy criteria to be satisfied and thereby permit interpolation of a capacitance value for $V_i$ (304) using the neighboring table entries (300, 302). However, when $V_i < V_1 < V_2$ as is shown in FIG. 3d, $V_1 - V_i < e_1$ and $C(V_2) - C(V_1) < e_2$ for the accuracy criteria to be satisfied and thereby permit interpolation of a capacitance value for $V_i$ (304) using the neighboring table entries (300, 302).

Figure 4:
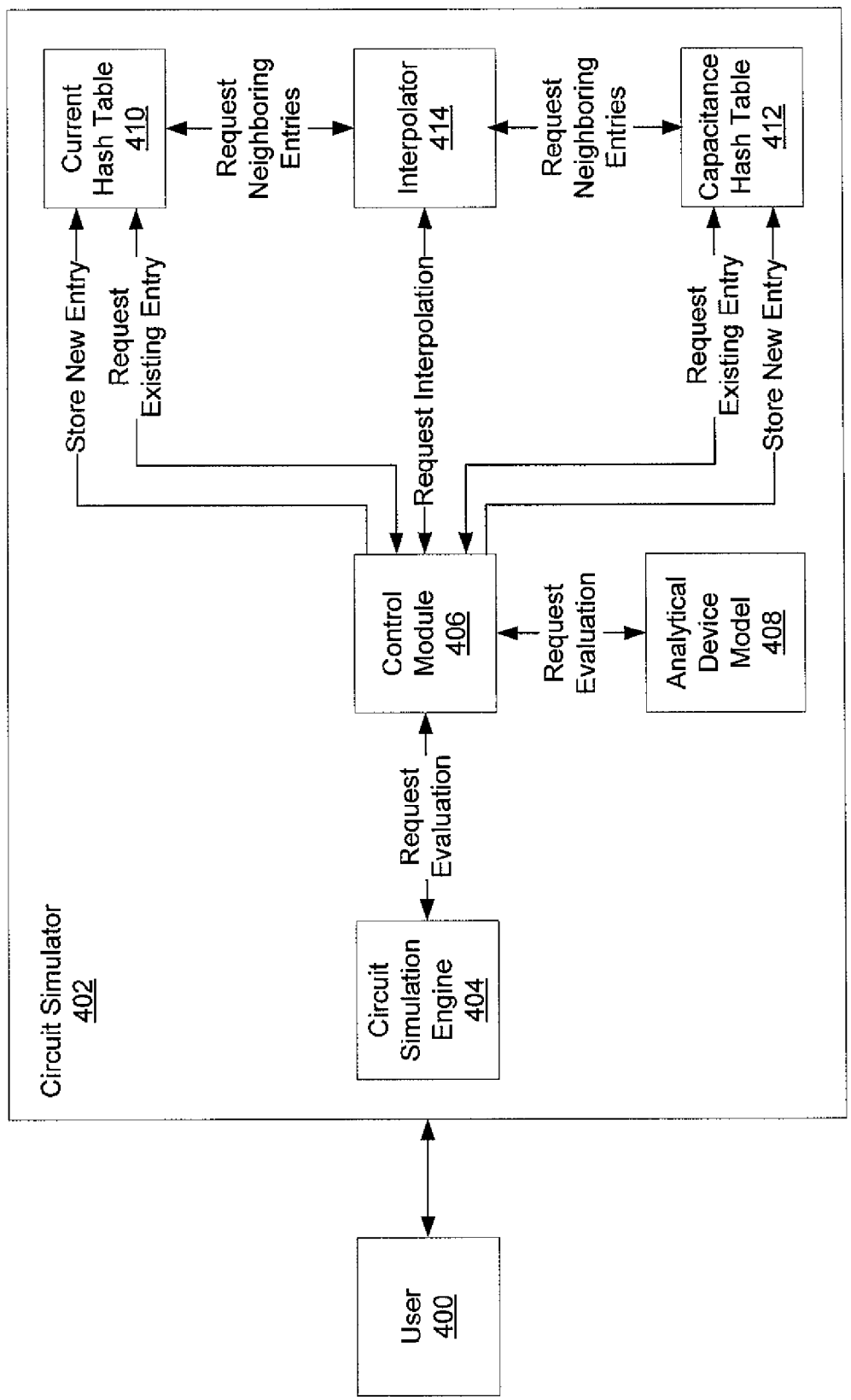
FIG. 4 shows a system representing a circuit simulation tool in accordance with one or more embodiments of the invention.

FIG. 4 shows a system in accordance with one or more embodiments of the invention. Specifically, in one or more embodiments of the invention, a user is operatively connected to and interacts with a circuit simulator (402) through a user interface (400).

The circuit simulator (402) includes a circuit simulation engine (404), an analytical device model (408), a current hash table (410), a capacitance hash table (412), an interpolator (414), and a control module (406). Each of these components is described below.

In one or more embodiments of the invention, the circuit simulation engine (404) is configured to generate and send a request for evaluating the device for a set of voltage input values. In one or more embodiments of the invention, the set of voltage input values for the request includes a voltage over drain, a voltage over gate, and a voltage over source. In one or more embodiments of the invention, the circuit simulation engine (404) is further configured to receive a response for the request including a current value and a capacitance value which correspond with the set of voltage input values specified in the request.

In one or more embodiments of the invention, the analytical device model (408), is configured to perform a calculation for obtaining a current value and a capacitance value. Current is calculated as a function of voltage over drain, a voltage over gate, and a voltage over source. Capacitance is calculated as a function of voltage over capacitor. As such, the analytical device model (408) is further configured to receive these above-listed voltage inputs as part of a request. Accordingly, the analytical device model (408) is further configured to respond to the request with a response specifying the calculated current and capacitance values.

In one or more embodiments of the invention, the current hash table (410) and the capacitance hash table (412) are configured to store one or more table entries. A table entry in the current hash table (410) includes a current value, a voltage over drain value, a voltage over gate value, and a voltage over source value. A table entry in the capacitance hash table (412) includes a capacitance value and a voltage over capacitor value. Neither table (410, 412) stores precharacterized data (i.e. data descriptive of a device generated prior to executing the circuit simulation) in its table entries. Rather, the data stored in table entries is obtained during the course of circuit simulation.

In one or more embodiments of the invention, the control module (406) is configured to receive a request specifying a set of input values. In one or more embodiments of the invention, the set of input values for the request includes a voltage over drain, a voltage over gate, and a voltage over source. In processing the request, the control module (406) obtains a current value and a capacitance value as a function of the set of input values specified in the request. The control module (406) is configured to obtain the current value and capacitance value: (i) from an entry stored in a hash table (410, 412); (ii) from interpolating between two entries stored in a hash table (410, 412); and (iii) from an analytical device model (408). The control module (406) is further configured to send a request to the current hash table (410) and the capacitance hash table (412) for storing a new table entry.

In one or more embodiments of the invention, the interpolator (414) is configured to receive a request comprising a set of voltage input values. In processing the request, the interpolator (414) uses the set of voltage input values to perform a linear interpolation of two table entries from the current hash table (410) and a linear interpolation of two table entries capacitance hash table (412). As a result of performing the two linear interpolations, the interpolator (414) obtains a current response value and a capacitance response value, which are specified by the interpolator (414) when it sends a response to the request. These response values correspond with the performance of the device when the device is configured using the set of voltage input values.

Figure 5:
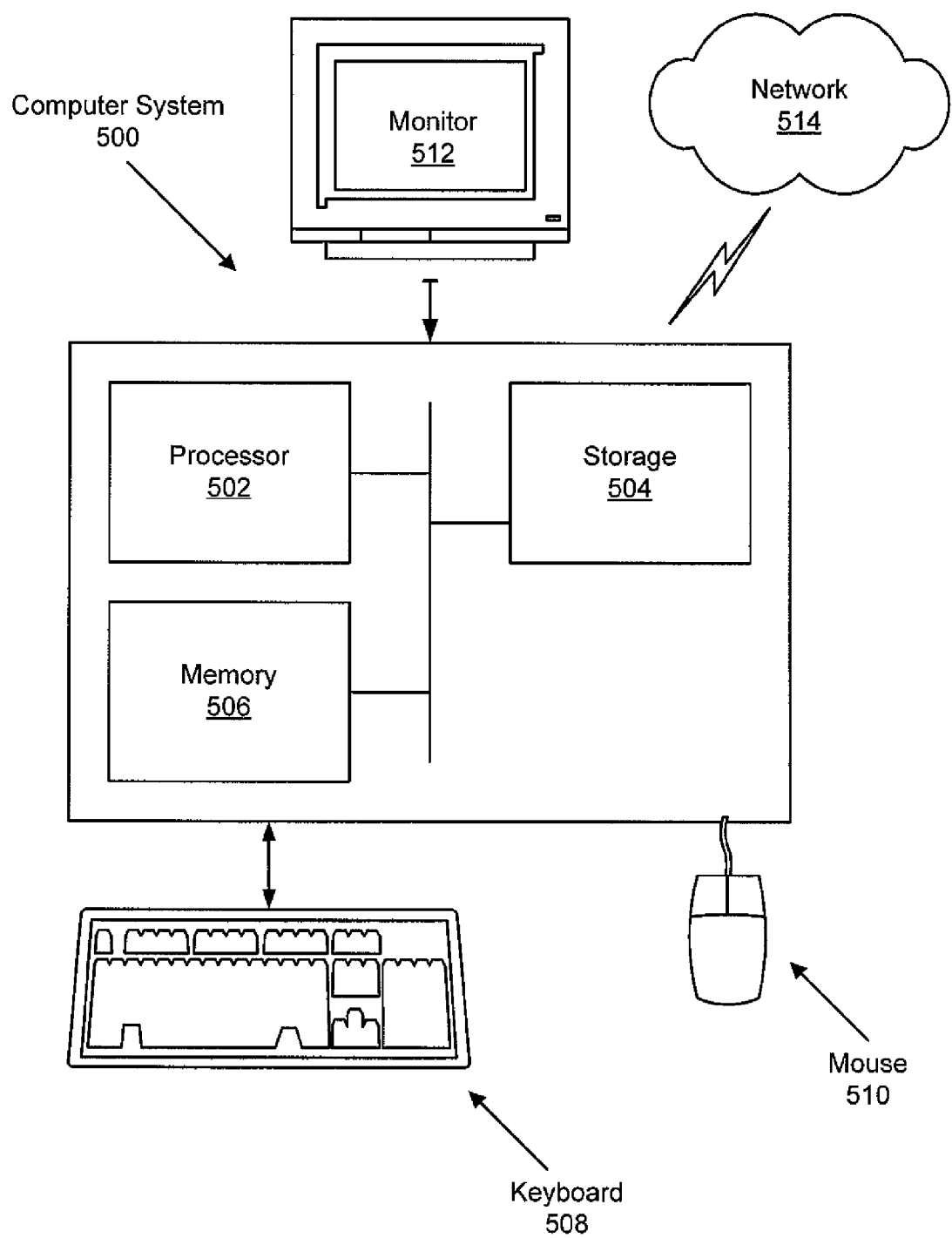
FIG. 5 shows a computer system in accordance with one or more embodiments of the invention.

Embodiments of the invention may be implemented on virtually any type of computer regardless of the platform being used. For example, as shown in FIG. 5, a computer system (500) includes one or more processors (502), associated memory (506) (e.g., random access memory (RAM), cache memory, flash memory, etc.), a storage device (504) (e.g., a hard disk, an optical drive such as a compact disc (CD) drive or digital video disk (DVD) drive, a flash memory stick, etc.), and numerous other elements and functionalities typical of today's computers (not shown). The computer (500) may also include input means, such as a keyboard (508), a mouse (510), or a microphone (not shown). Further, the computer (500) may include output means, such as a monitor (512) (e.g., a liquid crystal display (LCD), a plasma display, or cathode ray tube (CRT) monitor). The computer system (500) may be connected to a network (514) (e.g., a local area network (LAN), a wide area network (WAN) such as the Internet, or any other similar type of network) via a network interface connection (not shown). Those skilled in the art will appreciate that many different types of computer systems exist, and the aforementioned input and output means may take other forms. Generally speaking, the computer system (500) includes at least the minimal processing, input, and/or output means necessary to practice embodiments of the invention.

Further, those skilled in the art will appreciate that one or more elements of the aforementioned computer system (500) may be located at a remote location and connected to the other elements over a network. Further, embodiments of the invention may be implemented on a distributed system having a plurality of nodes, where each portion of the invention may be located on a different node within the distributed system. In one embodiment of the invention, the node corresponds to a computer system. Alternatively, the node may correspond to a processor with associated physical memory. The node may alternatively correspond to a processor with shared memory and/or resources. Further, software instructions to perform embodiments of the invention may be stored on a computer readable medium such as a digital video disc (DVD), flash memory stick, a compact disc (CD), a diskette, a tape, or any other computer readable storage device.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for evaluating a device during circuit simulation, comprising:
receiving a first request comprising a first input value, a second request comprising a second input value, and a third request comprising a third input value;
mapping the first input value to a first space in a table, the second input value to a second space in the table, and the third input value to a third space in the table,
wherein the table is configured to store one or more table entries,
wherein a table entry comprises an input value and a stored value, and
wherein the stored value is obtained as a function of the input value from an analytical device model used to characterize the device during circuit simulation;
determining whether the first space in the table is occupied by a first table entry, the second space in the table is occupied by a fourth table entry, and the third space in the table is occupied by a fifth table entry;
selecting a second table entry and a third table entry from the table when the first space in the table is not occupied by the first table entry, and a sixth table entry and a seventh table entry from the table when the third space in the table is not occupied by the first table entry,
wherein the second table entry and the third table entry are neighbors in relation to the first space in the table, and the sixth table entry and the seventh table entry are neighbors in relation to the third space in the table;

determining whether an accuracy criteria for performing a linear interpolation is satisfied as a function of the first input value, a stored value for the second table entry, and a stored value for the third table entry, and whether the accuracy criteria for performing a linear interpolation is satisfied as a function of the third input value, a stored value for the sixth table entry, and a stored value for the seventh table entry;

issuing a fourth request comprising the third input value to the analytical device model when the accuracy criteria for performing the linear interpolation is not satisfied;

obtaining a first response value by performing the linear interpolation of the stored value for the second table entry and the stored value for the third table entry when the accuracy criteria is satisfied, and a second response value when the second space in the table is occupied by the fourth table entry, wherein the second response value is the stored value for the fourth table entry, and wherein the first response value corresponds with the performance of the device when the device is configured using the first input value, and the second response value corresponds with the performance of the device when the device is configured using the second input value;

receiving a third response value from the analytical device model in response to the fourth request, wherein the third response value corresponds with the performance of the device when the device is configured using the third input value; and sending a response to the first request comprising the first response value, a response to the second request comprising the second response value, and a response to the third request comprising the third response value.

2. The method of claim 1, further comprising:
storing an eighth table entry in the table comprising the third input value and the third response value.

3. The method of claim 1, wherein the table is a hash table and is associated with a hash function that maps the first input value to the first space in the hash table.

4. The method of claim 3,
wherein a binary tree is generated as a function of the hash table, wherein a leaf in the binary tree corresponds with a space in the hash table and a node in the binary tree corresponds with a grouping of leaves,
wherein determining neighboring table entries in relation to a space in the hash table is performed using an iterative search of the binary tree, and
wherein the iterative search iterates bottom-up beginning with a leaf corresponding with the space in the hash table before iterating top-bottom to determine a neighboring table entry.

5. A system for evaluating a device during circuit simulation, comprising:
a circuit simulation engine, executing on a hardware processor, and configured to send a first request comprising a first input value;
a table configured to store one or more table entries,
wherein a table entry comprises an input value and a stored value, and
wherein the stored value is obtained as a function of the input value from an analytical device model used to characterize the device during circuit simulation;
an interpolator configured to perform a linear interpolation of neighboring table entries in the table to obtain a first response value using a first space in the table and the first input value,
wherein the analytical device model configured to perform a calculation for obtaining a third response value using a third input value; and
a control module, executing on the hardware processor, and configured to:
receive the first request comprising the first input value from the circuit simulation engine, a second request comprising a second input value from the circuit simulation engine, and a third request comprising the third input value from the circuit simulation engine;
map the first input value to the first space in the table, the second input value to a second space in the table, and the third input value to a third space in the table;
determine whether the first space in the table is occupied by a first table entry, whether the second space in the table is occupied by a second table entry, and whether the third space in the table is occupied by a third table entry;
provide the first response value and the first space in the table to the interpolator to obtain the first response value when the first space in the table is not occupied by a first table entry and when an accuracy criteria for performing the linear interpolation is satisfied;
obtain a second response value when the second space in the table is occupied by the second table entry,
wherein the second response value is the stored value for the second table entry, and
wherein the second response value corresponds with the performance of the device when the device is configured using the second input value;
issue a fourth request comprising the third input value to the analytical device model when the third space in the table is not occupied by the third table entry and when the accuracy criteria for performing the linear interpolation is not satisfied;
receive the third response value from the analytical device model in response to the fourth request;
send a response to the first request comprising the first response value to the circuit simulation engine, a response to the second request comprising the second response value to the circuit simulation engine, and a response to the third request comprising the third response value to the circuit simulation engine, and
store a fourth table entry in the table comprising the third input value and the third response value,
wherein the first response value corresponds with the performance of the device when the device is configured using the first input value, and the third response value corresponds with the performance of the device when the device is configured using the third input value.

6. The system of claim 5, wherein performing a linear interpolation of neighboring table entries in the table to obtain the first response value using the first space in the table and the first input value comprises:
selecting a fifth table entry and a sixth table entry, wherein the fifth table entry and the sixth table entry are neighbors in relation to the first space in the table;
determining whether the accuracy criteria for performing the linear interpolation is satisfied as a function of the first input value, a stored value for the fifth table entry, and a stored value for the sixth table entry; and obtaining the first response value by the linear interpolation of the stored value for the fifth table entry and the stored value for the sixth table entry when the accuracy criteria is satisfied.

7. The system of claim 5, wherein the table is a hash table and is associated with a hash function that maps the first input value to the first space in the table.

8. The system of claim 7,
wherein a binary tree is generated as a function of the hash table,
wherein a leaf in the binary tree corresponds with a space in the hash table and a node in the binary tree corresponds with a grouping of leaves,
wherein determining neighboring table entries in relation to a space in the hash table is performed using an iterative search of the binary tree, and
wherein the iterative search iterates bottom-up beginning with a leaf corresponding with the space in the hash table before iterating top-bottom to determine a neighboring table entry.

9. A non-transitory computer readable medium comprising executable instructions for evaluating a device during circuit simulation, wherein executable instructions comprise instructions to cause a computer to perform:
receiving a first request comprising a first input value, a second request comprising a second input value, and a third request comprising a third input value;
mapping the first input value to a first space in a table, the second input value to a second space in the table, and the third input value to a third space in the table,
wherein the table is configured to store one or more table entries,
wherein a table entry comprises an input value and a stored value, and
wherein stored value is obtained as a function of the input value from an analytical device model used to characterize the device during circuit simulation;
determining whether the first space in the table is occupied by a first table entry, whether the second space in the table is occupied by a fourth table entry, and whether the third space in the table is occupied by a fifth table entry;
selecting a second table entry and a third table entry from the table when the first space in the table is not occupied by the first table entry, and a sixth table entry and a seventh table entry from the table when the third space in the table is not occupied by the fifth table entry,
wherein the second table entry and the third table entry are neighbors in relation to the first space in the table, and
wherein the sixth table entry and the seventh table entry are neighbors in relation to the third space in the table;
determining whether an accuracy criteria for performing a linear interpolation is satisfied as a function of the first input value, a stored value for the second table entry, and a stored value for the third table entry, and whether the accuracy criteria for performing a linear interpolation is satisfied as a function of the third input value, a stored value for the sixth table entry, and a stored value for the seventh table entry;
obtaining a first response value by performing the linear interpolation of the stored value for the second table entry and the stored value for the third table entry when the accuracy criteria is satisfied, and a second response value when the second space in the table is occupied by the fourth table entry,
wherein the first response value corresponds with the performance of the device when the device is configured using the first input value;
wherein the second response value is the stored value for the fourth table entry, and
wherein the second response value corresponds with the performance of the device when the device is configured using the second input value;
issuing a fourth request comprising the third input value to the analytical device model when the accuracy criteria for performing the linear interpolation is not satisfied;
receiving a third response value from the analytical device model in response to the fourth request,
wherein the third response value corresponds with the performance of the device when the device is configured using the third input value;
sending a response to the first request comprising the first response value, a response to the second request comprising the second response value, and a response to the third request comprising the third response value, and
storing an eighth table entry in the table comprising the third input value and the third response value.

10. The non-transitory computer readable medium of claim 9,
wherein the table is a hash table and is associated with a hash function that maps the first input value to the first space in the hash table.

11. The non-transitory computer readable medium of claim 10,
wherein a binary tree is generated as a function of the hash table,
wherein a leaf in the binary tree corresponds with a space in the hash table and a node in the binary tree corresponds with a grouping of one or more leaves, and
wherein determining neighboring table entries in relation to a space in the hash table is performed using a bottom-up iterative search of the binary tree beginning with a leaf corresponding with the space in the hash table.

12. A method for evaluating a device during circuit simulation, comprising:
receiving a first request comprising a first input value;
mapping the first input value to a first space in a table,
wherein the table is configured to store one or more table entries,
wherein a table entry comprises an input value and a stored value, and
wherein the stored value is obtained as a function of the input value from an analytical device model used to characterize the device during circuit simulation;
determining whether the first space in the table is occupied by a first table entry;
selecting a second table entry and a third table entry from the table when the first space in the table is not occupied by the first table entry,
wherein the second table entry and the third table entry are neighbors in relation to the first space in the table;
determining whether an accuracy criteria for performing a linear interpolation is satisfied as a function of the first input value, a stored value for the second table entry, and a stored value for the third table entry;
obtaining a first response value by performing the linear interpolation of the stored value for the second table entry and the stored value for the third table entry when the accuracy criteria is satisfied,
wherein the first response value corresponds with the performance of the device when the device is configured using the first input value; and sending a response to the first request comprising the first response value, wherein the table is a hash table and is associated with a hash function that maps the first input value to the first space in the hash table, wherein a binary tree is generated as a function of the hash table, wherein a leaf in the binary tree corresponds with a space in the hash table and a node in the binary tree corresponds with a grouping of leaves, wherein determining neighboring table entries in relation to a space in the hash table is performed using an iterative search of the binary tree, and wherein the iterative search iterates bottom-up beginning with a leaf corresponding with the space in the hash table before iterating top-bottom to determine a neighboring table entry.

13. A system for evaluating a device during circuit simulation, comprising:

a circuit simulation engine, executing on a hardware processor, and configured to send a first request comprising a first input value;

a table configured to store one or more table entries,
wherein a table entry comprises an input value and a stored value, and
wherein the stored value is obtained as a function of the input value from an analytical device model used to characterize the device during circuit simulation;

an interpolator configured to perform a linear interpolation of neighboring table entries in the table to obtain a first response value using a first space in the table and the first input value;

a control module, executing on the hardware processor, and configured to:
receive the first request comprising the first input value from the circuit simulation engine;
map the first input value to the first space in the table;
determine whether the first space in the table is occupied by a first table entry;
provide the first response value and the first space in the table to the interpolator to obtain the first response value when the first space in the table is not occupied by a first table entry and when an accuracy criteria for performing the linear interpolation is satisfied; and
send a response to the first request comprising the first response value to the circuit simulation engine, wherein the first response value corresponds with the performance of the device when the device is configured using the first input value, wherein the table is a hash table and is associated with a hash function that maps the first input value to the first space in the table, wherein a binary tree is generated as a function of the hash table, wherein a leaf in the binary tree corresponds with a space in the hash table and a node in the binary tree corresponds with a grouping of leaves, wherein determining neighboring table entries in relation to a space in the hash table is performed using an iterative search of the binary tree, and wherein the iterative search iterates bottom-up beginning with a leaf corresponding with the space in the hash table before iterating top-bottom to determine a neighboring table entry.

14. A non-transitory computer readable medium comprising executable instructions for evaluating a device during circuit simulation, wherein executable instructions comprise instructions to cause a computer to perform:

receiving a first request comprising a first input value;

mapping the first input value to a first space in a table,
wherein the table is configured to store one or more table entries,
wherein a table entry comprises an input value and a stored value, and
wherein stored value is obtained as a function of the input value from an analytical device model used to characterize the device during circuit simulation;

determining whether the first space in the table is occupied by a first table entry;

selecting a second table entry and a third table entry from the table when the first space in the table is not occupied by the first table entry,
wherein the second table entry and the third table entry are neighbors in relation to the first space in the table;

determining whether an accuracy criteria for performing a linear interpolation is satisfied as a function of the first input value, a stored value for the second table entry, and a stored value for the third table entry;

obtaining a first response value by performing the linear interpolation of the stored value for the second table entry and the stored value for the third table entry when the accuracy criteria is satisfied,
wherein the first response value corresponds with the performance of the device when the device is configured using the first input value; and sending a response to the first request comprising the first response value, wherein the table is a hash table and is associated with a hash function that maps the first input value to the first space in the hash table, wherein a binary tree is generated as a function of the hash table, wherein a leaf in the binary tree corresponds with a space in the hash table and a node in the binary tree corresponds with a grouping of one or more leaves, and wherein determining neighboring table entries in relation to a space in the hash table is performed using a bottom-up iterative search of the binary tree beginning with a leaf corresponding with the space in the hash table.

* * * * *